United States Patent [19]

Henderson et al.

[11] Patent Number: 5,177,782
[45] Date of Patent: Jan. 5, 1993

[54] MODULAR PROTECTED ENTRANCE TERMINAL

[75] Inventors: Daniel H. Henderson; Charles W. Hoffman; Richard J. Scherer, all of St. Paul, Minn.

[73] Assignee: Minnesota Mining and Manufacturing Company, St. Paul, Minn.

[21] Appl. No.: 575,076

[22] Filed: Aug. 30, 1990

[51] Int. Cl.⁵ .................................................. H04M 9/00
[52] U.S. Cl. .................................... 379/412; 379/399; 379/442; 379/429
[58] Field of Search ............. 379/399, 412, 442, 429

[56] References Cited

U.S. PATENT DOCUMENTS

| D. 291,081 | 7/1987 | Mickelson et al. | D14/52 |
|---|---|---|---|
| 3,093,773 | 6/1963 | Cole | 427/117 |
| 4,215,381 | 9/1978 | Heisinger | 361/124 |
| 4,317,154 | 2/1982 | Passarella | 361/119 |
| 4,390,921 | 6/1983 | Baumbach | 361/119 |
| 4,488,008 | 12/1984 | Delinger | 179/81 |
| 4,588,238 | 5/1986 | Mickelson et al. | 339/91 R |
| 4,613,732 | 9/1986 | Cwirzen et al. | 379/412 |
| 4,616,288 | 10/1986 | Scholtholt et al. | 361/119 |
| 4,624,514 | 11/1986 | Smith | 379/412 |
| 4,723,919 | 2/1988 | Crane | 439/521 |
| 4,742,541 | 5/1988 | Cwirzen et al. | 379/412 |
| 4,747,018 | 5/1988 | Munsey et al. | 361/399 |
| 4,749,359 | 6/1988 | White | 379/399 X |
| 4,800,588 | 1/1989 | Poster, Jr. | 379/412 |
| 4,853,960 | 8/1989 | Smith | 379/399 X |
| 4,860,350 | 8/1989 | Smith | 379/399 X |
| 4,910,770 | 3/1990 | Collins et al. | 379/412 X |
| 4,922,374 | 5/1990 | Mueller et al. | 361/119 |
| 4,932,051 | 6/1990 | Karan et al. | 379/399 |
| 4,945,559 | 7/1990 | Collins et al. | 379/442 X |
| 4,949,376 | 8/1990 | Nieves et al. | 379/399 |
| 4,979,209 | 12/1990 | Collins et al. | 379/399 |

OTHER PUBLICATIONS

CP-762 Network interface device, J103, 1985.
Keptel's SN1-500, Oct. 1985.

Primary Examiner—James L. Dwyer
Assistant Examiner—Magdy W. Shehata
Attorney, Agent, or Firm—Gary L. Griswold; Walter N. Kirn; John C. Barnes

[57] ABSTRACT

An entrance terminal and interface between the telephone company network and the subscriber's premises is more readily serviced by a single module having an enclosed printed circuit board combining the voltage overload device, the demarcation plug and socket and a service circuit such as a half-ringer or maintenance termination unit.

6 Claims, 7 Drawing Sheets

MODULAR PROTECTED ENTRANCE TERMINAL

BACKGROUND OF THE INVENTION

1. Field of the Invention

The present invention generally relates to terminals for use in the telecommunications industry for separating the wires of the telephone company network from the inside wiring of the subscriber, and more particularly to a module for an entrance terminal which incorporates, adjacent to the demarcation point, overvoltage protection, a jack, and a half-ringer or a maintenance termination unit.

2. Description of the Prior Art

It has become a requirement that there be a demarcation between the telephone lines of the telephone company and terminal protective equipment and the subscribers lines at the premises for data communication equipment and/or telephones. The demarcation point is preferably outside the premises to allow access at any time by the telephone company and is to be where the wiring crosses a property line or the closest point to where the wiring enters a multi-unit building or buildings. The demarcation point for single unit installations is positioned within twelve inches of the protector or, where there is no protector, within twelve inches of where the telephone wire enters the customer's premises.

The prior art teaches the use of modules for the connection of incoming telephone lines and the customers lines. These prior art modules comprise a module for connection to the incoming telephone lines and a modular plug and jack for plugging in of the customers lines. The module not only includes the plug-in arrangement but can incorporate the line protectors, and other circuits for performing service functions. Two patents disclosing such prior art devices are U.S. Pat. Nos. 4,613,732 and 4,742,541.

U.S. Pat. No. 4,588,238 discloses a simplistic telephone network interface where the incoming lines and the customers lines are joined at the interface by an RJIIC modular plug and jack. A similar interface is illustrated in patent No. Des. 291,081. The use of such or similar modular devices is illustrated in U.S. Pat. Nos. 4,723,919; 4,749,359; and 4,800,588.

Other protected entrance terminals have used interface connectors as described to be positioned between a panel adapted to support a plurality of surge arrestors and individual ringers or maintenance termination units in series with the interface connectors. These terminals used protective devices as described in U.S. Pat. No. 4,583,954 which plugged into the panels.

In all these devices the physical size of the terminals were larger and they were more costly than desired by the service companies to protect the customer lines and to afford electronic checks to be made on the network lines in the event of a report of some malfunction.

The present invention affords an alternative to having to acquire entrance panels with expandable properties and then as necessary add the protection equipment to plug into the panel and the suitable circuitry to improve the servicing of the lines.

SUMMARY OF THE INVENTION

The present invention provides a novel module for an entrance terminal which is adapted to use one or a series of modules to connect an incoming cable to the lines of one or more subscribers.

The terminal includes a module for use at the interface between telephone company communications facilities incoming lines and the wiring at a subscriber's premises. The module comprises a printed circuit board having a first pair of contacts for receiving the incoming tip and ring lines, a third contact for connection to ground, and an outgoing pair of contacts, the fourth and fifth, for connection to the wiring at a subscriber's premises. A surge arrestor for overvoltage protection is mounted on the printed circuit board and is joined to the first pair of contacts which are also connected through the board to an engagable socket or jack for a modular plug. The plug is connected to the board by a flexible cord and at least two mounting pads, and circuit means afford connection between the mounting pads and an outgoing pair of contacts.

The circuit means of the module may include a half-ringer circuit. The first pair of contacts and the outgoing pair of contacts comprise tuning fork contacts for making sliding contact with blade contacts joined to the incoming lines and the wiring at the subscriber's premises for affording facile attachment and detachment of the module from the lines and wiring. The module may further comprise a pair of shells which enclose the printed circuit board, allow access to the socket and permit the contacts to extend therefrom for affording wiping connection of the contacts to fixed contacts of an otherwise open circuit between the telephone company lines and the premise wiring.

A protected entrance terminal according to the present invention comprises support means for mounting at least a pair of mating contacts, adapted for connection to two incoming lines, and for supporting a ground bar. A post is positioned perpendicular to the support, which post supports a pair of mating contacts having means for connection to a pair of customers wires. The post has hinge means affording one portion of a pivot axis. A module comprising a generally rectangular box, having opposite faces joined by side walls, encloses a printed circuit device having a surge protector device and a plurality of wiping contacts extending from two adjacent side walls of the box for mating with the earlier mentioned contacts. The box further has means for cooperating with the hinge means for affording pivotal movement of the box in relationship to the post to make successive connection between the mating contacts on the post and the wiping contacts extending from one side wall of the module and then to make successive contact between a wiping contact on an adjacent side wall and the ground bar, and a further electrical contact between the other wiping contacts, extending from the adjacent side wall, and the mating contacts supported on the support means when the module is pivoted about the post hinge means.

A protected entrance terminal for receiving the incoming lines from a telephone company's facility and connecting the same to the wiring from a subscriber's premises according to the present invention comprises a housing unit having a base and a cover, inlet openings in the base for insertion of cables and wires into the base, means in the base for defining a splicing area, support means positioned in the base for mounting at least a pair of like contacts adapted for connection to two incoming lines from a cable and for supporting a ground bar, post means positioned upright in the base for supporting at least a pair of mating contacts having connectors for connection to a pair of wires, and hinge means on the post means defining one portion of a pivot axis about which a modular interface device may be pivoted to connect the otherwise open circuit between the company cable and the subscriber wires as described above.

BRIEF DESCRIPTION OF THE DRAWINGS

The present invention will be further described hereinafter with reference to the accompanying drawing wherein.

DESCRIPTION OF THE PRESENTLY PREFERRED EMBODIMENTS

Figure 1:
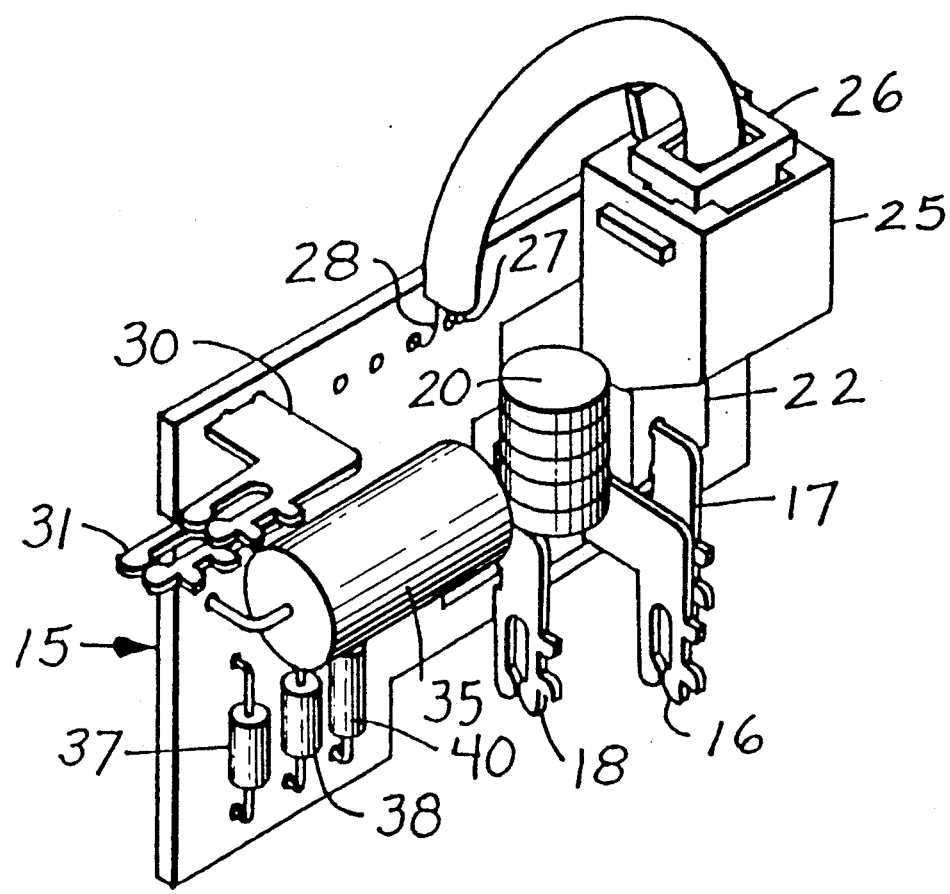
FIG. 1 is an isometric view of the circuit board of the module of the present invention.
Figure 2:
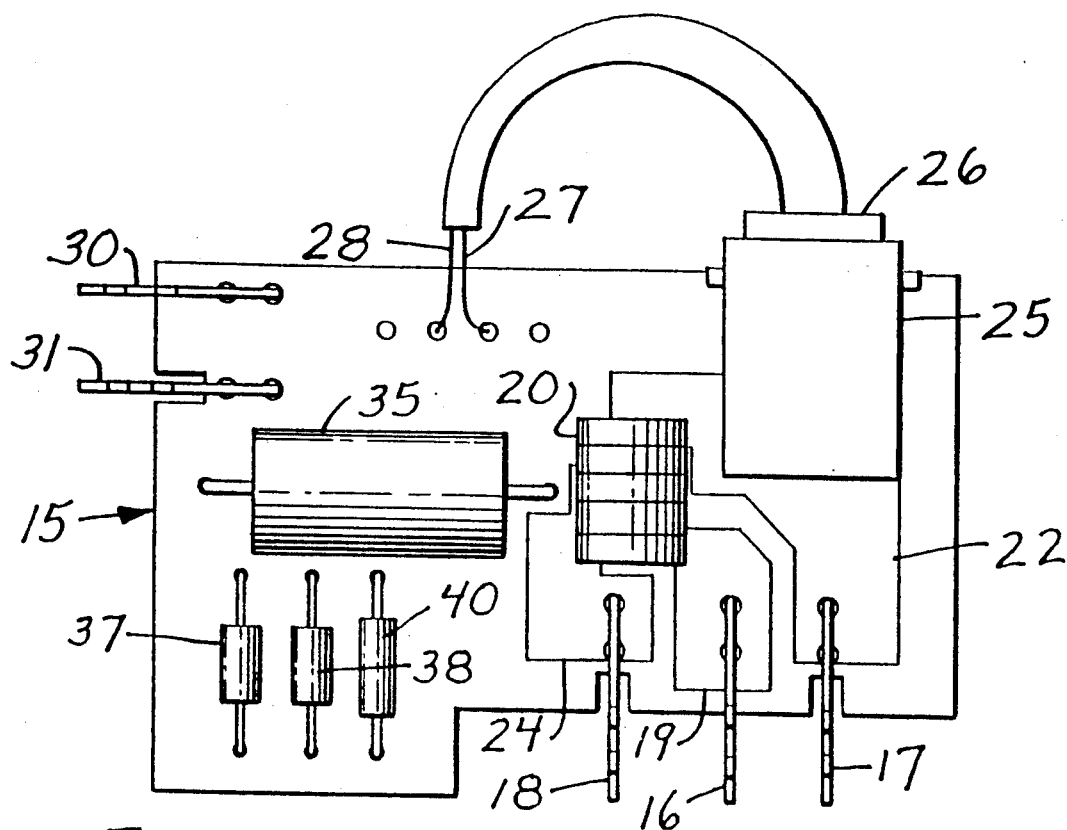
FIG. 2 is a plan view of the front of the circuit board.
Figure 3:
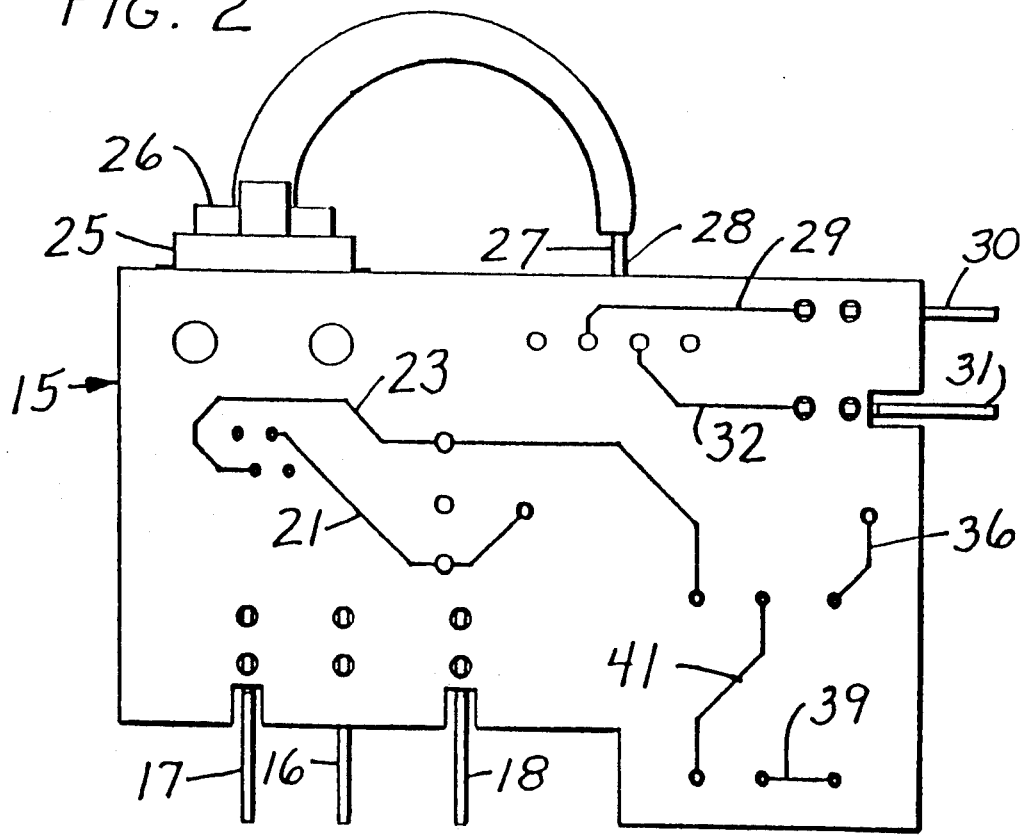
FIG. 3 is a plan view of the back side of the circuit board.

The module and protected entrance terminal of the present invention will now be described in greater detail with reference to the accompanying drawing wherein like reference numerals refer to like parts throughout the several views.

The module of the present invention is for use at the interface between telephone company communications facilities incoming cable to an entrance terminal and the wiring at a subscriber's premises. Referring now to FIG. 1, the module comprises a printed circuit board, generally designated 15, supporting components to protect the subscriber's lines and electronic circuits to perform other service functions, such circuits being e.g. a half ringer or a maintenance termination unit. The board 15 has a first pair of contacts, illustrated as the tuning fork type of wiping contact, a tip contact 16 and a ring contact 17, for receiving the incoming lines from the telephone company facility. A third contact 18 is connected to the board for connection to a ground contact. The contact 16 is connected by a large electrically conductive path or via 19 formed on the printed circuit board to one end of a surge protection device 20, such as a gas tube, and to a conductive path or via 21 on the back side of the board. Contact 17 is connected to the opposite end of the overload protection device 20 by a via 22 and to a second via 23 on the rear side of the board. The ground contact 18 is connected by via 24 to the central terminal of the protection device 20 to carry any overload to ground that might enter the board from the company lines. The board traces or vias 21 and 23 are connected to the contacts of a jack or socket 25 which is an established jack for use with a modular plug. A plug 26 is removably connected to the socket 25 and has, as illustrated, at least a pair of flexible wires 27 and 28 in a sheath leading to through holes in the board 15 and to vias 29 and 32 connecting the wires to two additional, the fourth and fifth, contacts 30 and 31 adapted for connection to the wires of the subscriber's premises. The circuit board as described provides protection to the customer and allows the company or the customer to disconnect the line by separating the plug 26 from the socket 25.

A half-ringer circuit is added to this board 15 by mounting a capacitor 35 between via 21 and a via 36 leading to one end of a diode 37, which is connected in series to a second diode 38, by via 39, which diode 38 is connected to a resistor 40 by via 41 to via 23.

Figure 4:
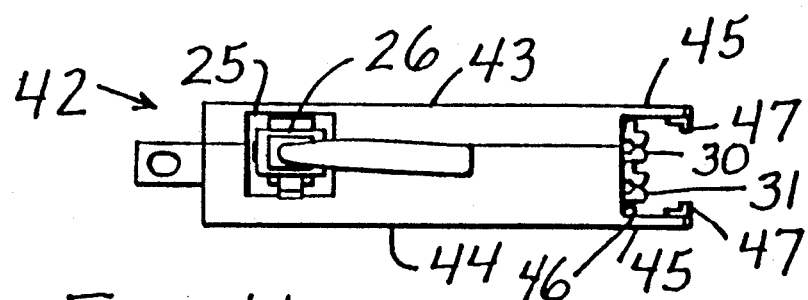
FIG. 4 is top view of the module of the present invention.
Figure 5:
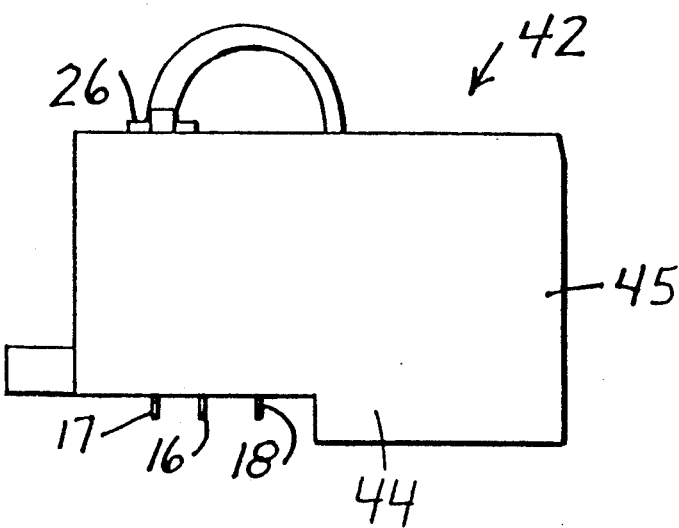
FIG. 5 is a side elevational view of the module.
Figure 6:
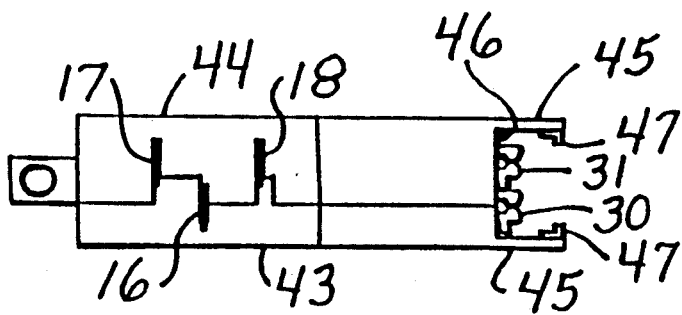
FIG. 6 is a bottom view of the module.

Referring now to FIGS. 4, 5, and 6. The module 42 is illustrated in finished form, and disposed in a generally rectangular box having opposite faces and side walls which is formed by two shells 43 and 44, secured or bonded together to enclose the printed circuit board 15. The box has a step in the lower side wall to expose the contacts 16, 17 and 18 and the shells each have a flange 45 extending the opposite faces beyond side wall 46 through which the contacts 30 and 31 extend. The flanges 45 form means to guide the module onto the post and are each formed with an extended stud 47 to form part of a hinge for the module as will be explained.

Figure 7:
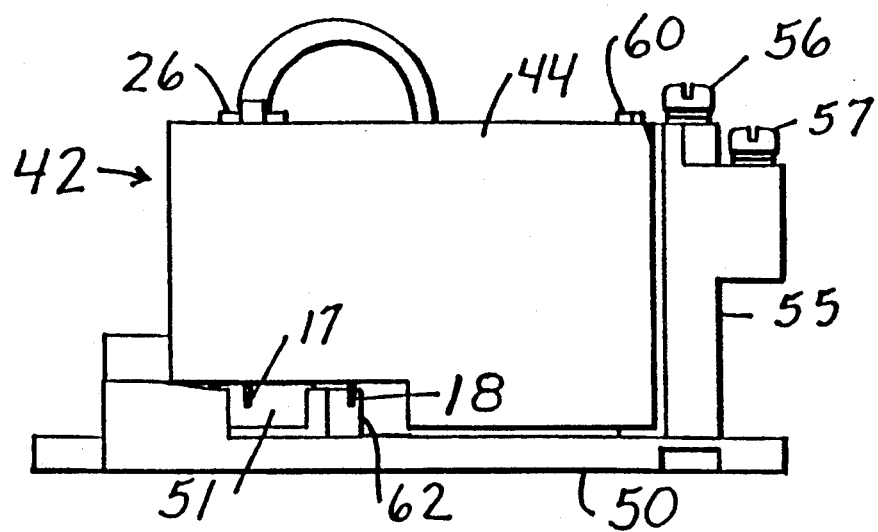
FIG. 7 is a side elevational view of the module connected to the mating contacts of a terminal.
Figure 8:
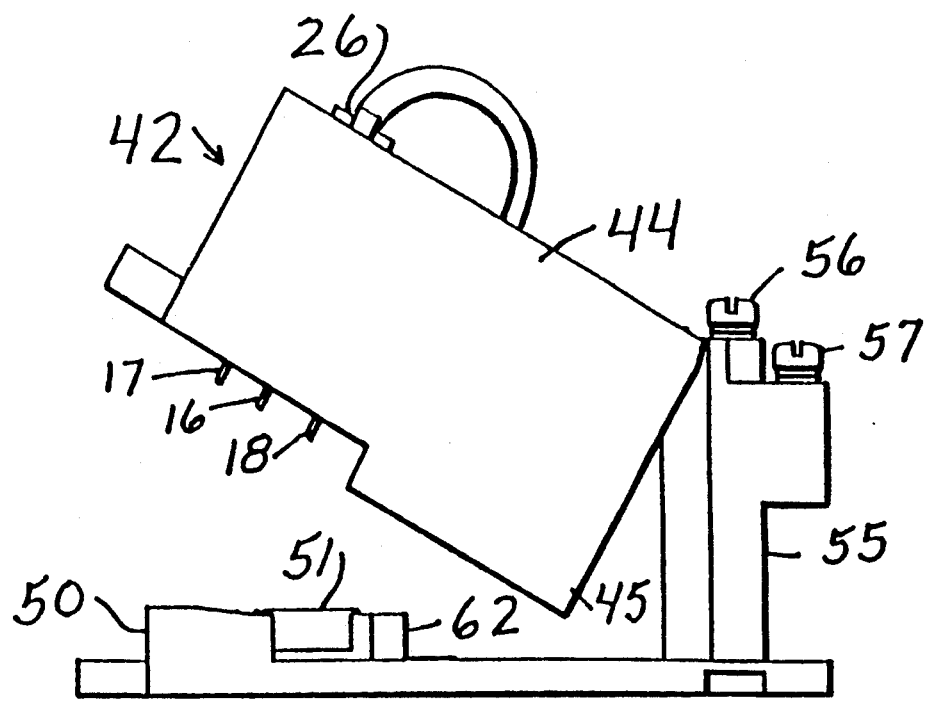
FIG. 8 is a side elevational view of the module being pivoted in relationship to the terminal.
Figure 9:
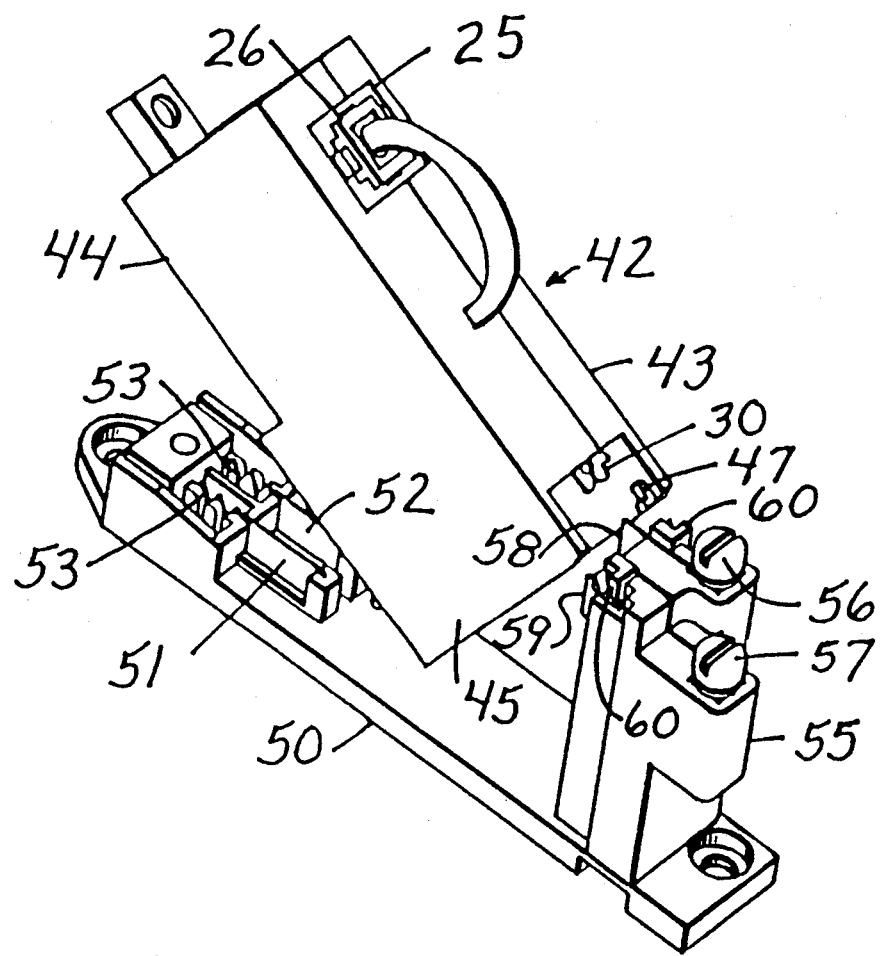
FIG. 9 is an isometric exploded view showing the module being removed or placed on the terminal.

The module 42 is adapted to fit into a terminal and be moved into place to connect a normally open circuit between the company lines and the customer wires. As illustrated in FIGS. 7, 8 and 9, the terminal is provided with an electrically insulative support member 50 which has a length greater than the length of the module 42. At one end of the support 50 is an eye for receiving a hold down fastener and supports for a pair of contacts 51 and 52 which are formed of plate-like conductive metal and formed at one end with insulation displacing U-shaped slots 53 to receive the ends of lines from the telephone company. The rest of the contacts 51 and 52 define a contact mating with the wiping contacts, and as illustrated they are blade contacts, which blades extend toward the opposite end of the support and are suitably held in fixed position by molded ribs on the support. At the other end of the support 50 is mounted a post 55 which extends perpendicularly to the support and supports a pair of binding posts 56 and 57 which are connected to two blade contacts 58 and 59 respectively. The blade contacts 58 and 59 are also shown in FIG. 11.

The post 55 is also provided, adjacent the top thereof, with hinge means in the form of ears 60 which receive therein the studs 47, when the module is placed at about 60° and the studs are moved into the ears. Placing the module 42 as described, the module can then be pivoted to successively make connection between contact 30 and the blade 58, then between the contact 31 and the blade 59, then between the ground contact 18 and a mating contact or a mating blade type contact 62 on a ground bar 63 (see FIGS. 7, 8 and 10) to protect the customers wires and the telephone company's lines prior to connecting the final two wiping contacts 16 and 17 successively to the contacts 52 and 51, respectively. It has been found that making the connections successively reduces the insertion force needed to connect the module into the circuit as the wiping contacts are opened successively.

Figure 10:
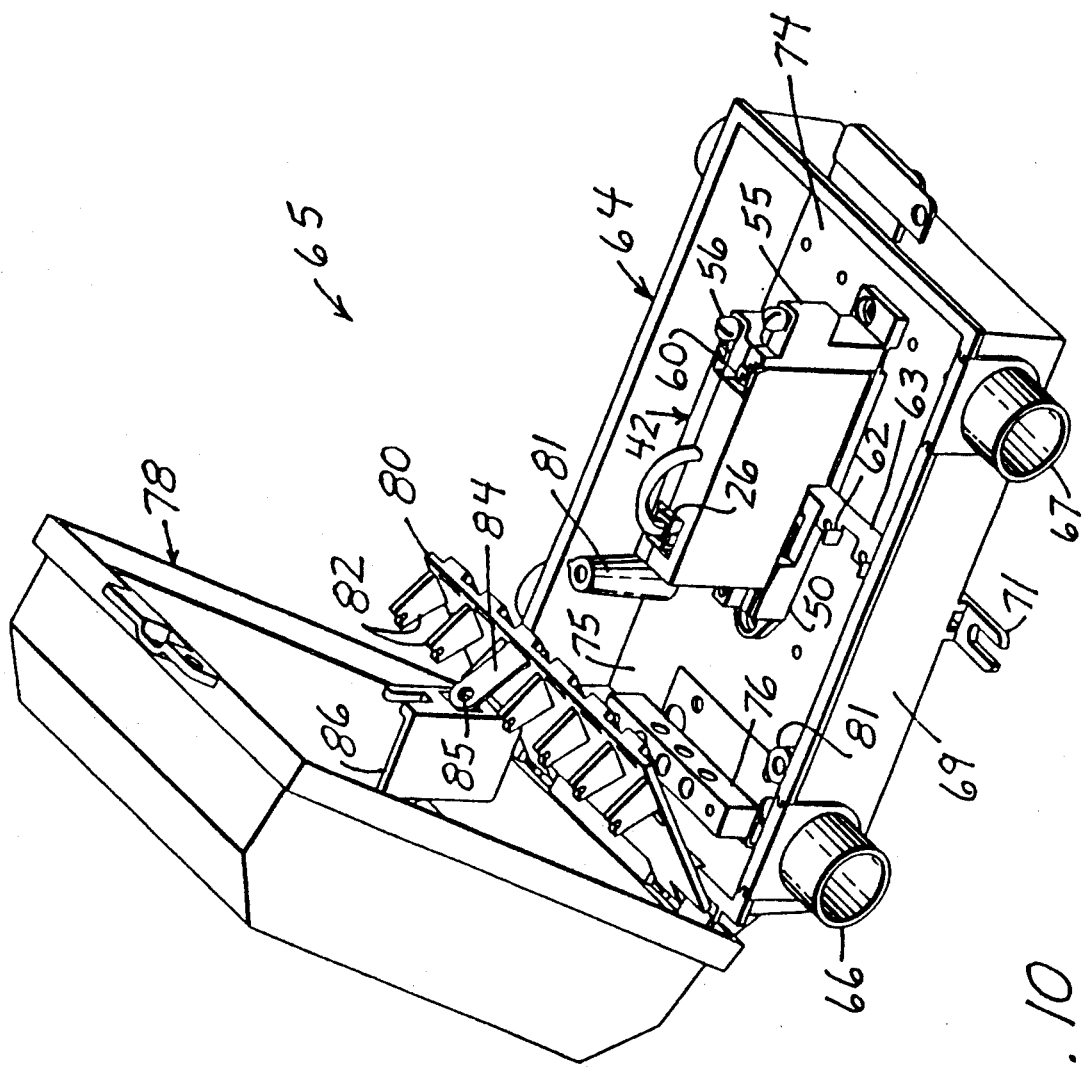
FIG. 10 is an isometric view of a protected entrance terminal according to the present invention.
Figure 11:
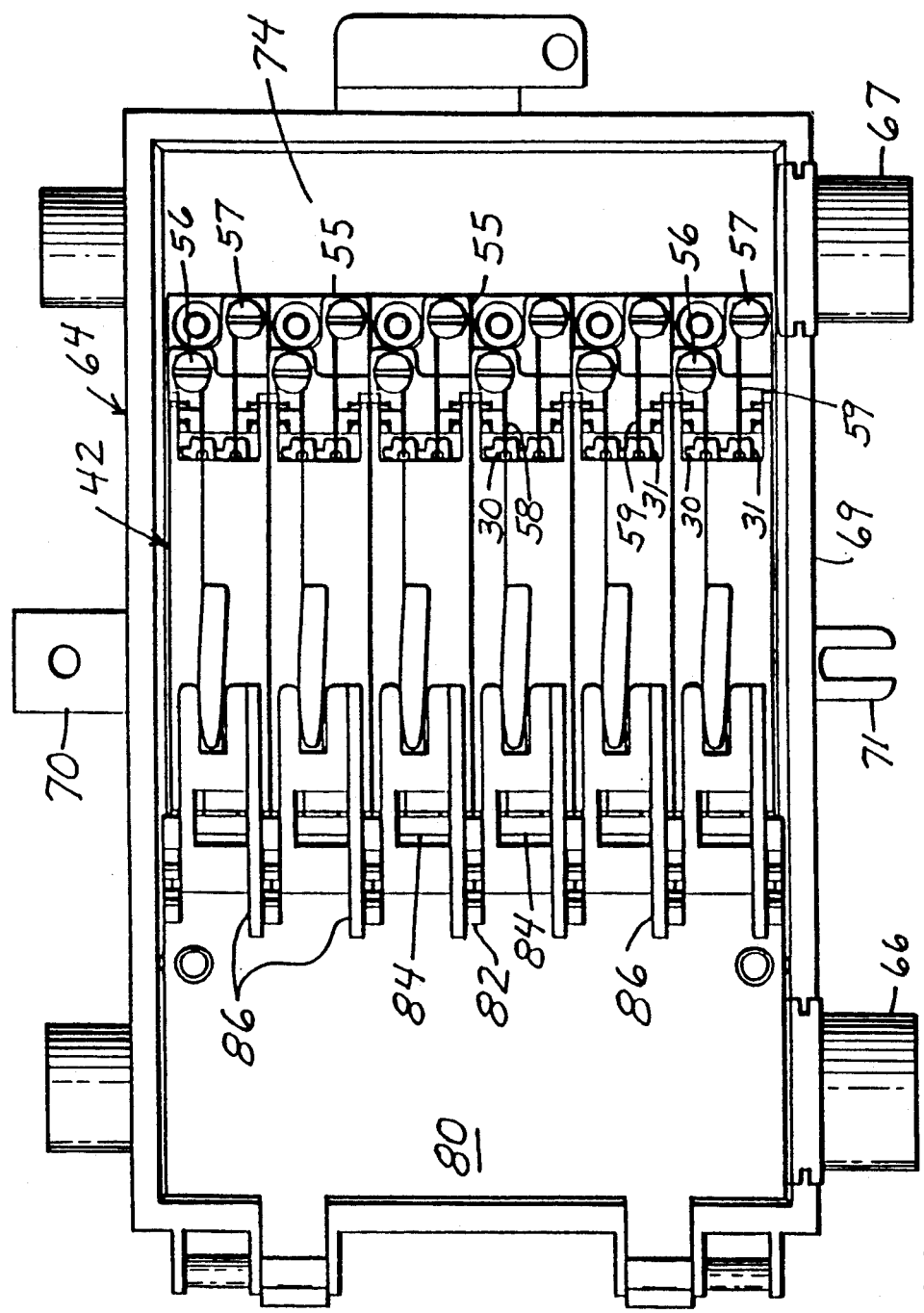
FIG. 11 is a front elevational view of the base of a protected entrance terminal showing a plurality of modules therein.

Referring again to FIG. 10, and to FIG. 11, there is illustrated a support 50 mounted in a support means or base 64 of a protected entrance terminal 65. The terminal 65 is formed with at least two access openings receiving boots 66 and 67 in the bottom wall 69. The terminal 65 is adapted to be mounted on a wall by mounting brackets 70 and 71 to place the back wall 74 parallel to the wall. The telephone company cable is adapted to enter the boot 66 and the customer's wires enter through boot 67. The base 64 has sufficient space to accommodate a splicing area, generally designated 75, where the incoming cable is terminated and spliced to individual wires joined to the connectors 51 and 52 in the support members 50. A ground line also enters through the boot 66 and is connected to a ground bar 76, which bar 76 is connected by another wire, not shown, to the ground bar 63.

A single support 50 and a single module 42 is illustrated in the terminal base 64 in FIG. 10 for simplicity. Alternatively, the support member could be formed to accommodate a plurality of towers. The support could be molded to fit on the back wall 74 of the terminal 65 and accommodate a plurality of modules.

Hinged to one edge of the base 64 is a cover 78 to enclose the module or modules. To the same edge of the base, is connected a protective plate 80, which is adapted to cover the splicing area and is generally locked to the base by fasteners which pass through the plate into supports 81. On the front face of the protective plate 80 there is mounted a plurality of spacers 82, and brackets 84, only one of which is shown in FIG. 10, with eyes 85 for receiving the shackle of a padlock to lock an L-shaped frame 86 in place. The frames 86 have bifurcated legs on the foot of the L-shaped frame to straddle the sheath for the wires 27 and 28 connected to the plugs 26, such that when the frame 86 is in place and locked by a padlock, access to the plug to separate the same from the socket 25 is denied. The padlocks are not illustrated in FIG. 11 for simplicity but this view illustrates a plurality of modules 42 in a base 64, ready to receive the incoming service lines from the company and the wires from the customers.

Having thus described the present invention with reference to a presently preferred embodiment thereof, it is to be understood that changes may be made without departing from the spirit or scope of the invention as described in the appended claims.

We claim:

1. A protected entrance terminal comprising,
    support means for mounting a pair of contacts adapted for connection to two incoming lines and for supporting a ground bar,
    a post positioned perpendicular to said support, said post supporting a pair of contacts having means for connection to a pair of wires, and said post having hinge means affording one portion of a pivot axis,
    a module comprising a generally rectangular box having opposite faces joined by side walls and enclosing a voltage protector device and having a plurality of wiping type contacts extending from two adjacent side walls of said box, and means for cooperating with said hinge means for affording pivotal movement of said box in relationship to said post to make connection between said contacts on said post and said wiping type contacts extending from one side wall and then to make contact between a ground contact extending from said adjacent side wall and said ground bar, and then between the wiping type contacts extending from said adjacent side wall and the pair of contacts supported by said support means, when said hinge means affords pivotal movement of said module.

2. A protected entrance terminal according to claim 1 wherein said module further comprises a printed circuit board supporting the pair of said tuning fork contacts for receiving the incoming lines, the tuning fork contact for connection to said ground contact, and an outgoing pair of the tuning fork contacts for connection to the wiring at a subscriber's premises,
    surge arrestor means for overvoltage protection mounted on said board and joined to said pair of contacts for receiving the incoming lines and for protecting other electronic circuits on said board and being connected to an engagable plug socket, a plug, which plug is connected to said board by a flexible cord and at least two vias connected to said outgoing pair of tuning fork contacts, and
    circuit means connected to said first pair of contacts for performing service functions.

3. A protected entrance terminal according to claim 2 wherein a plurality of modules are connected to said support means and to said ground bar and a plurality of posts connect said modules to subscriber's premises wiring.

4. A protected entrance terminal for receiving the incoming lines from a telephone company's facility and connecting the same to the wiring from a subscriber's premises, said terminal comprising a housing unit having a base and a cover, said base having inlet openings for insertion of cables and wires into said base,
    means in said base for defining a splicing area.
    support means positioned in said base for mounting at least a pair of blade contacts adapted for connection to two incoming lines from a said cable and for supporting a ground bar,
    post means positioned upright in said base for supporting at least a pair of blade contacts having electrical contact means connected thereto for connection to a pair of wires, and said post means having hinge means affording one portion of a pivot axis,
    at least one module comprising a generally rectangular box having opposite faces joined by side walls and enclosing a surge arrestor for overvoltage protection and having a plurality of wiping contacts extending from two adjacent side walls of said box, and means cooperating with said hinge means for affording pivotal movement of said box in relationship to said post means to make connection between said pair of blade contacts on said post and said wiping contacts extending from one side wall and then to make contact between a wiping contact and said ground bar extending from an adjacent side wall, and then to make successive connection between the wiping contacts on said adjacent side wall and the pair of blade contacts supported on the support means upon pivotal movement of said module.

5. A protected entrance terminal according to claim 4 wherein said module comprises
    a printed circuit board having mounted thereon
        a first pair of said contacts for receiving the incoming lines,
        a third contact for connection to said ground bar,
        an outgoing pair of contacts for connection to the wiring at a subscriber's premises,
        said surge arrestor joined to said first pair of contacts to protect other electronic circuits on said board.

a socket mounted to said board and connected to said first pair of contacts.

a plug is connected to said board by a flexible cord and at lest two vias connecting said flexible cord to said outgoing pair of contacts.

6. A protected entrance terminal according to claim 5 wherein additional electronic circuit means are mounted on said board between and connected between said surge arrestor and said socket.

* * * * *